United States Patent [19]
Holst et al.

[11] Patent Number: 5,999,039
[45] Date of Patent: Dec. 7, 1999

[54] ACTIVE POWER SUPPLY FILTER

[75] Inventors: John Christian Holst; Donald A. Draper, both of San Jose, Calif.

[73] Assignee: Advanced Micro Devices, Inc., Sunnyvale, Calif.

[21] Appl. No.: 08/938,063

[22] Filed: Sep. 26, 1997

Related U.S. Application Data

[60] Provisional application No. 60/027,329, Sep. 30, 1996.

[51] Int. Cl.$^6$ ...................................................... H01J 19/82
[52] U.S. Cl. ........................... 327/532; 327/198; 327/546
[58] Field of Search ..................................... 327/143, 198, 327/545, 546, 532, 391, 398, 399; 323/901; 307/126, 130; 712/208, 214, 215

[56] References Cited

U.S. PATENT DOCUMENTS

| | | | |
|---|---|---|---|
| 3,870,905 | 3/1975 | Chikazawa | 327/474 |
| 4,591,745 | 5/1986 | Shen | 307/592 |
| 4,775,829 | 10/1988 | Achstaetter | 323/313 |
| 5,391,996 | 2/1995 | Marz | 327/158 |
| 5,467,039 | 11/1995 | Bae | 327/198 |
| 5,565,811 | 10/1996 | Park et al. | 327/546 |
| 5,686,848 | 11/1997 | Mes et al. | 327/143 |
| 5,809,273 | 9/1998 | Favor et al. | 395/386 |
| 5,828,251 | 10/1998 | Freyman et al. | 327/143 |

FOREIGN PATENT DOCUMENTS

| | | | |
|---|---|---|---|
| 464667 | 6/1990 | European Pat. Off. | 327/143 |
| 0 449 310 A2 | 10/1991 | European Pat. Off. | |

OTHER PUBLICATIONS

"Transistor Filter for Switching Regulator", IBM Technical Disclosure Bulletin, vol. 24, No. 2, Jul. 1981, New York, p. 890 XP–002056516.

*Primary Examiner*—Kenneth B. Wells
*Assistant Examiner*—Hai L. Nguyen
*Attorney, Agent, or Firm*—Skjerven, Morrill, MacPherson, Franklin, & Friel, L.L.P.; Ken J. Koestner

[57] ABSTRACT

An active power supply filter effectively eliminates power supply noise using a resistive element and a capacitive element coupled at a node, and a switch with a control terminal controlled by the node. The active power supply filter is suitable for high frequency operation of a voltage-controlled oscillator (VCO) in a phase-locked loop (PLL) of a high-speed microprocessor. The active power supply filter removes VCO noise that would otherwise create jitter that reduces the effective clock cycle of the microprocessor. The active power supply filter is similarly useful in applications other than VCOs, PLLs, and microprocessors in which removal of substantial amounts of noise from the power supply is useful.

6 Claims, 6 Drawing Sheets

ACTIVE POWER SUPPLY FILTER

This application claims benefit of Provisional Appl. 60/027,329, filed on Sep. 30, 1996.

BACKGROUND OF THE INVENTION

1. Field of the Invention

The present invention relates to active filter electronic circuits. More specifically, the present invention relates to active filter circuits for effectively removing noise from a power supply.

2. Description of the Related Art

Microprocessor architectures are continually evolving to improve and extend the capabilities of personal computers. Execution speed, power consumption, and circuit size are aspects of microprocessors and microprocessor performance that are constantly addressed by processor architects and designers in the ongoing quest for an improved product. As the execution speed of microprocessors has reached and exceeded 200 MHz and continues to increase, the importance of maintaining a high fidelity timing signal becomes increasingly important.

Microprocessors typically use a clock distribution system to supply timing signals to the various microprocessor operating circuits. The clock distribution system buffers timing signals and supplies timing signals having a suitably accurate frequency and duty cycle. In high speed microprocessors, the accuracy of frequency and duty cycle reproduction becomes increasingly important. One technique for supplying an accurate timing signal involves generation of a clock signal by a phase-locked loop (PLL) and distribution of the clock signal over the large area of the integrated circuit, while maintaining the clock skew to a specified tight tolerance throughout that area.

One aspect of maintaining a highly accurate timing signal is ensuring that the power supply to the PLL and the voltage-controlled oscillator (VCO) driving the PLL has a strictly limited amount of noise. Noise in the power supply signal to the VCO results in jitter that greatly reduces the effective frequency of the clock signal distributed over the large area of the integrated circuit. Present day and future microprocessor operating speeds are only attained if the noise in the power supply signal is highly limited.

Conventional integrated circuits typically use an RC filter to attenuate the power supply noise on a external dedicated VDD line coming into the integrated circuit chip. The RC filter typically includes a variable resistor or potentiometer element for manually adjusting the characteristics of the filter. One problem with the conventional integrated circuit and RC filter is that the PLL circuit typically has dual countermanding requirements of a high power requirement and a large amount of filtering to the input power supply voltage. A suitable RC filter for the demands of power supply filtering uses a large resistance and typically a large capacitance. However, a resistor suitably large for removing power supply noise is also so large that the voltage drop across the resistance effectively lowers the power supply voltage applied to the PLL excessively. Furthermore, the large capacitance of the RC filter disadvantageously increases capacitive coupling. If a large capacitor is fabricated on an integrated circuit chip, the area consumed may be prohibitively large. If the large capacitor is formed off-chip, coupling problems may arise.

What is needed is a power supply filter that removes power supply noise for high frequency operation of a circuit, such as a microprocessor, multimedia processor, or other types of circuit, so that further increases in execution speed are possible.

SUMMARY

An active power supply filter effectively eliminates power supply noise using a resistive element and a capacitive element coupled at a node, and a switch with a control terminal controlled by the node. The active power supply filter is suitable for high frequency operation of a voltage-controlled oscillator (VCO) in a phase-locked loop (PLL) of a high-speed microprocessor. The active power supply filter removes VCO noise that would otherwise create jitter that reduces the effective clock cycle of the microprocessor. The active power supply filter is similarly useful in applications other than VCOs, PLLs, and microprocessors in which removal of substantial amounts of noise from the power supply is useful.

The active power supply filter is highly useful for setting filter characteristics that cannot be practically achieved in a conventional RC filter. In particular, the active power supply filter described herein permits implementation of a filter having a pole such that the RC time constant is very low compared to the time constant of the noise that a phase-locked loop (PLL) is typically afflicted. The RC time constant set by the active power supply filter attenuates the power supply noise to allow the PLL to track and offset or cancel any induced jitter. For example, if the RC time constant is set at 60 Hz and the PLL has a VCO that generates a VCO frequency of approximately 1 MHz, noise on the power supply causes the PLL to operate at an increased speed. The increased operating speed is detected by a phase detector in the PLL, causing the VCO frequency to decrease, thereby tracking and canceling the noise. The RC time constant is to be set sufficiently low that the phase-locked loop tracks and cancels the noise, correcting any jitter effect that detrimentally slows the execution speed of a circuit.

It has been discovered that an active power supply filter including a resistance and a capacitance forming an RC filter element, and a switch connected to the RC filter element, supplies current to a circuit directly. The current through the RC filter resistance does not drive active circuitry so that no DC current flow necessarily flows through the resistance. Accordingly, the resistance, and thus the RC time constant, may be made arbitrarily large so that the active power supply filter is defined to optimize filter characteristics without regard to the effect of the resistance in supplying power to the circuit. In contrast, a conventional RC filter draws the supply current through a resistor, causing a voltage drop equal to the product of the resistance and the supply current.

Many advantages are achieved by the described filter circuit and operating method. It is highly advantageous that the filter characteristics of the active power supply filter are specified to best reduce power supply noise without reducing the supply current to the circuit supplied by the power supply. The active power supply filter advantageously includes a switch separating the RC filter and a target circuit that advantageously attains a high degree of noise immunity. In a phase-locked loop circuit distributing clock signals throughout an integrated circuit in a microprocessor, the active power supply filter advantageously reduces jitter so that the microprocessor executes at a higher frequency.

BRIEF DESCRIPTION OF THE DRAWINGS

The features of the described embodiments believed to be novel are specifically set forth in the appended claims.

However, embodiments of the invention relating to both structure and method of operation, may best be understood by referring to the following description and accompanying drawings.

DETAILED DESCRIPTION OF THE ILLUSTRATIVE EMBODIMENTS

Figure 1:
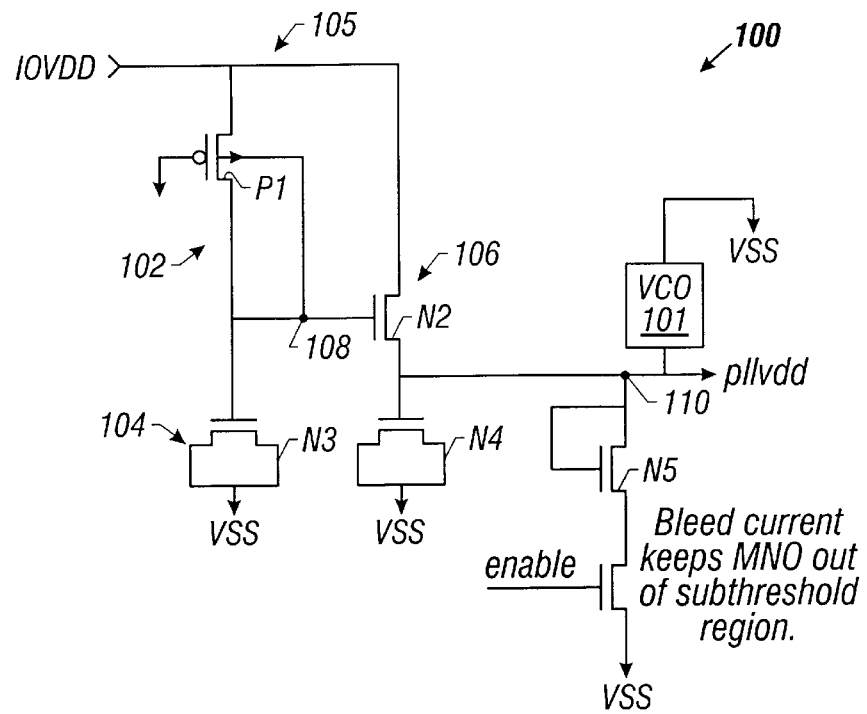
FIG. 1 is a schematic circuit diagram illustrating an embodiment of an active power supply filter for greatly attenuating noise on a line supplying power to an integrated circuit.

Referring to FIG. 1, a schematic circuit diagram illustrates an embodiment of an active power supply filter 100 for greatly attenuating noise on a line supplying power to an integrated circuit. The active power supply filter 100 is designed generally to remove transient, large-amplitude noise from the power supply to an integrated circuit. In the shown embodiment, the active power supply filter 100 supplies a filtered power supply for the operation of a voltage-controlled oscillator (VCO) 101 of a phase-locked loop (PLL) circuit. The active power supply filter 100 fundamentally includes a resistive element 102, a capacitive element 104, and a switch 106. The resistive element 102 and the capacitive element 104, in combination, form an RC element 105 that defines an RC time constant for the active power supply filter 100.

The filtering operation of the active power supply filter 100 primarily results from the N-channel transistor N2, an N-channel pass transistor that serves as a large series all-pass element with a very low output impedance on the order of approximately 1/gm. The N-channel transistor N2 is connected into the active power supply filter 100 as a series element in which bias is applied to the gate terminal of the N-channel transistor N2 so that the bias of the gate terminal is equal to the power supply DC voltage.

In the illustrative embodiment, the resistive element 102 is a p-channel MOSFET P1 having a source-drain pathway connected between an input power source IOVDD and a switch node 108 connected to the capacitive element 104 and connected to a control terminal of the switch 106. The p-channel MOSFET P1 has a gate terminal connected to a reference source such as VSS and a backgate connected to the switch node 108. The capacitive element 104 is an n-channel MOS capacitor N3 connected between the switch node 108 and the VSS reference. The switch 106 is an n-channel MOSFET N2 having a source-drain pathway connected between the input power source IOVDD and an internal VDD supply node 110, and a gate connected to the switch node 108. The internal VDD supply node 110 is the internal power supply for circuits in the integrated circuit. In the illustrative embodiment, the supply powers a voltage controlled oscillator (VCO) of a phase-locked loop (PLL) and is therefore described as a PLLVDD supply.

The switch 106 advantageously separates the current path of the RC element 105 from the circuit powered by the input power source IOVDD, here the VCO 101. In contrast to conventional RC power supply filters which draw current for supplying a target circuit through the resistor, the active power supply filter 100 supplies power to the target circuit through the very low impedance n-channel MOSFET N2 with the RC element 105 having a separate current path. In the active power supply filter 100, the resistive element 102, here the p-channel MOSFET P1, charges the capacitive element 104, here the n-channel MOS capacitor N3, but does not drive the active circuitry of the VCO 101 load. The resistive element 102 does not supply a DC current flow for driving the VCO 101 load so that the RC time constant defined by the RC element 105 may be set arbitrarily large, based on the desired filtering operation alone. The RC time constant is defined without regard to the voltage drop across the resistive element 102 since the DC voltage drop is zero across the resistive element. The dominant source of capacitance in the RC element 105 is the capacitance from the switch node 108 to ground, the VSS reference, through n-channel MOS capacitor N3. The RC element 105 therefore sets the gate of n-channel MOSFET N2 to a highly stable voltage with very little noise and the small amount of noise being below the pole of the RC constant defined by the RC element 105.

The gate of N-channel transistor N2 is held at VDDA by the highly resistive P-channel transistor P1. To avoid noise coupling from VDDA, the well of P-channel transistor P1 is tied to the gate of N-channel transistor N2, causing the P+ to n-well diode of P-channel transistor P1 to be forward biased during power-up. Forward biasing of the diode is counteracted by forming a guard ring around the P-channel transistor P1. The N3 capacitor and P1 resistor supplying a very stable gate voltage to N-channel transistor N2. The N-channel transistor N2 does not regulate the voltage but instead delivers a voltage of IOVDD-VTN so that a voltage drop of approximately 950 to 1320 mV is applied from the input terminal to the output terminal of the active power supply filter 100 across all process corners. The P-channel transistor P1 and an NMOS capacitor N3 operate as low-pass filter elements, setting the lowpass filter −3 dB point at 22 kilohertz and establishing a first pole. N-channel transistor N4 serves as a bleeder transistor that biases N-channel transistor N2 in the high gm range, lowering the impedance on PLLVDD.

The voltage drop across the switch 106 from the input power source IOVDD to the load VCO 101 is an NMOS threshold voltage from the gate to the source of the n-channel MOSFET N2. Although the voltage drop across n-channel MOSFET N2 reduces the voltage supply to the VCO 101, it is advantageous that the voltage drop is essentially constant. Furthermore, the disadvantage of the voltage drop across n-channel MOSFET N2 is minimized in many integrated circuits such as microprocessor circuits that have a higher voltage supplying input/output circuits and a lower voltage supplying the core process. For example, in some microprocessors the input/output supply is 3.3 volts and the core process operates at 2.5 volts. Thus, the voltage drop across the n-channel MOSFET N2 coincidentally matches or nearly matches the existing operating power supply levels. In other circuit embodiments that do not include multiple supply reference voltages, other techniques such as usage of a current pump to generate a higher voltage supply to the RC element 105 are used.

Because the NMOS threshold voltage drop determines the PLLVDD supply voltage and because the n-channel MOSFET N2 is an active device, the voltage at the drain terminal of n-channel MOSFET N2 can be varied without changing the PLLVDD supply. Accordingly, the voltage of the internal VDD supply node 110 with respect to the VSS reference is very constant with little noise. The circuits supplied by the input power source IOVDD, in the illustrative embodiment the VCO 101 and the PLL, are referenced between the PLLVDD supply and the VSS reference. A noise or variation in voltage does not affect the operation of circuits within the local reference, resulting in an effectively noise-free local power supply. The VCO 101 and PLL in the local circuits powered by the PLLVDD supply, having a supply voltage determined virtually exclusively by the NMOS threshold voltage of the n-channel MOSFET N2, are effectively immune from variations in the input power source IOVDD.

To effectively isolate the PLLVDD supply from the input power source IOVDD, the capacitance from the drain to the source of n-channel MOSFET N2 is set to a small value in comparison to the filter capacitance of the PLLVDD supply, specifically the capacitance of the n-channel MOS capacitor N5. In addition, the channel length for n-channel MOSFET N2 is set slightly larger than the minimum channel length to prevent noise on the input power source IOVDD from reverse biasing the n-channel MOSFET N2. Reverse biasing occurs when a low-going noise pulse on the input power source IOVDD is below the gate voltage by a threshold amount. Reverse biasing draws current from the PLLVDD supply, reversing the source-drain configuration of the n-channel MOSFET N2.

A capacitor such as n-channel MOS capacitor N4, which is omitted in some embodiments of an active power supply filter, is connected between the internal VDD supply node 110 and the VSS reference. The n-channel MOS capacitor N4 assists in maintaining the PLLVDD supply at a relatively constant voltage despite temporal variations in the load of the circuit supplied by the PLLVDD supply. The n-channel MOS capacitor N4 filters the voltage variations between the PLLVDD supply and the VSS reference, assisting in isolating the VCO 101 and PLL in the local circuits powered by the PLLVDD supply and enhancing immunity of the local circuits to variations in the input power source IOVDD. The n-channel MOS capacitor N4 sets the voltage differential from the PLLVDD supply to VSS reference to a constant difference value for the load circuit VCO 101. Thus, noise in the VSS ground affects all circuits in the load uniformly and the voltage reference of the circuits is virtually noise-free. The n-channel MOS capacitor N4 allows the n-channel MOSFET N2 to be a smaller transistor and still maintain a high rejection of noise.

A current source such as diode-connected n-channel MOSFET N5 is connected between the internal VDD supply node 110 and the VSS reference. The n-channel MOSFET N5 is omitted in some embodiments of a active power supply filter. The n-channel MOSFET N5 is connected in series with n-channel MOSFET N2 and operates to maintain n-channel MOSFET N2 outside threshold conduction operation. The n-channel MOSFET N5 draws a fixed bleed current from the internal VDD supply node 110 to the VSS reference to ensure the n-channel MOSFET N2, the switching transistor, remains outside the subthreshold conduction operating region and maintains a high transconductance. By using the n-channel MOSFET N5 to bleed current from internal diode-connected VDD supply node 110, a smaller n-channel MOSFET N2 is employed which operates with a lower output impedance, generates smaller parasitic oscillations, and less noise, at the cost of a small bleed current. In a typical embodiment, the bleed current is approximately 15 milliamps.

The NMOS capacitor N4 and the N-channel transistor N2 contribute a second pole at approximately 19 Mhz.

In response to the simulated application of a square wave signal applied to VDDA with an amplitude of 500 mV and a risetime of 100 ps, the VCO supply has a mere 22 mV ripple on PLLVDD. Supply noise attenuation is greater than 25 dB from 400 kHz to 10 GHz.

Figure 2:
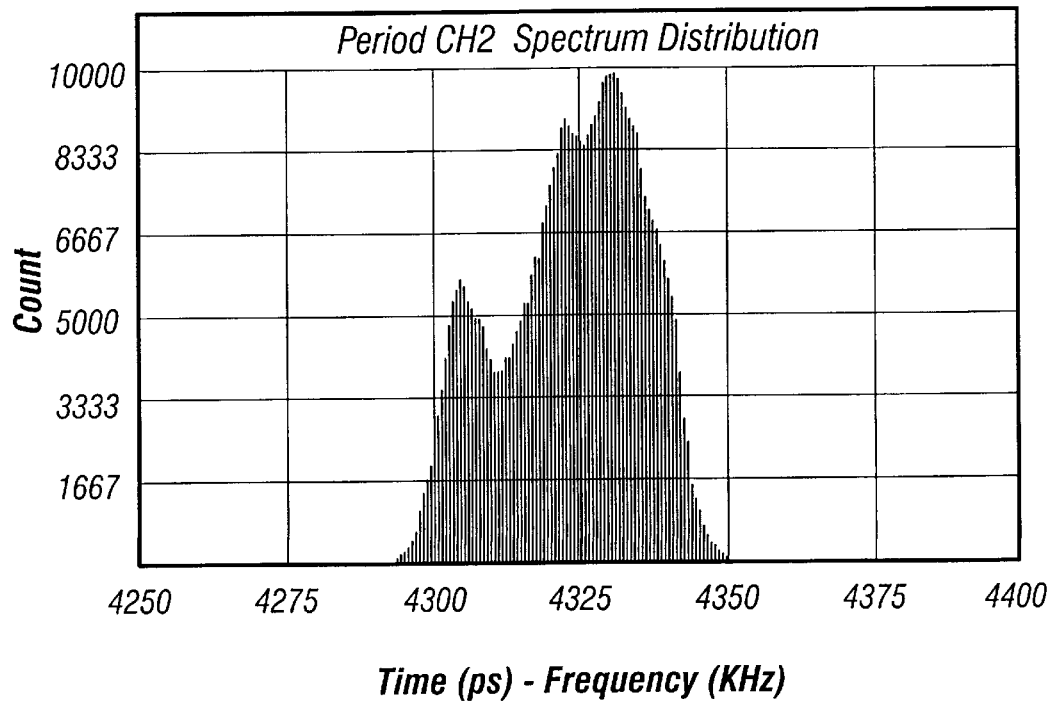
FIG. 2 is a graph that shows a cycle-to-cycle jitter measurement for the phase-locked loop in a circuit using the active power supply filter to reduce jitter.

Referring to FIG. 2, a graph shows a cycle-to-cycle jitter measurement for the phase-locked loop (ILL) 402 in a circuit using the active power supply filter 100 to reduce jitter. The cycle-to-cycle jitter is measured disabling the PCLK timing signal through the operation of the output multiplexer 608 shown in FIG. 6 while the microprocessor 300 is operating at a clock frequency of 233 MHz. The measured cycle-to-cycle jitter is determined to have a peak-to-peak value of +/−33.6 ps for a total of 67.2 ps.

Figure 3:
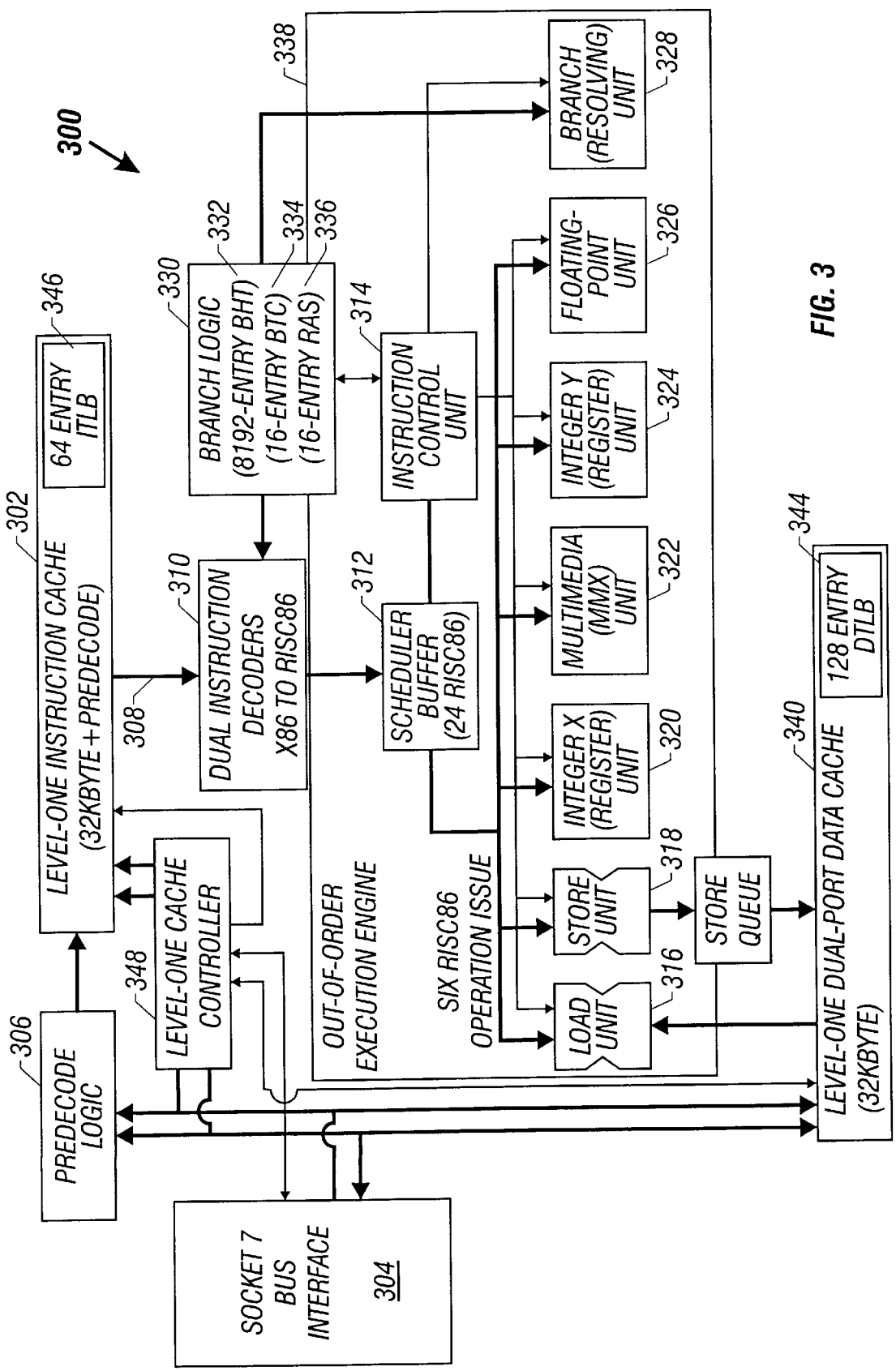
FIG. 3 is an architectural block diagram that illustrates an embodiment of a microprocessor in accordance with an embodiment of the present invention.

Referring to FIG. 3, a schematic block diagram illustrates an embodiment of an AMD-K6 microprocessor 300. The microprocessor 300 is an X86 instruction set-compatible microprocessor implementing a set of Multi-Media eXtenstions (MMX). A level-one (L1) instruction cache 302 begins predecoding instructions obtained from a processor system bus interface 304 during filling of the 32 KB two-way associative L1 instruction cache 302. The L1 instruction cache 302 includes a 64-entry instruction translational lookahead buffer (ITLB) 346. Bypass (not shown) and storage buffers (not shown) for instructions (4×16) and predecode (4×20) to the L1 instruction cache 302 are supplied to allow data-in and data flow-back to cache output terminals.

A level-one cache controller 348 controls caching in the L1 instruction cache 302. The L1 instruction cache 302 uses a Most Recently Used (MRU) prediction technique to predict the way selection on cache accesses. A misprediction in the way selection results in a penalty of one cycle. The L1 instruction cache 302 line replacement algorithm is Least Recently Used (LRU) although an alternative random replacement algorithm is supported using an SR5.ICERLR configuration bit. The L1 instruction cache 302 also supports a direct-mapped replacement algorithm, reducing the cache size from 32 KB to 16 KB, using an SR5.ICDM configuration bit.

The L1 instruction cache 302 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The microprocessor 300 includes predecode logic 306 and a predecode cache 307 to identify instruction boundaries and fill the L1 instruction cache 302. Once the L1 instruction cache 302 is filled, predecode bits are stored in the 20 kB predecode cache 307. Predecode bits resolved during the predecoding operation are stored in a 20 KB predecode cache 307. Predecode logic 306 includes a first stage of instruction decode logic. Data from the L1 instruction cache 302 are fetched by fetch logic 308 and transferred to dual instruction decoders 310. The dual instruction decoders 310 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 310 are transferred to a RISC86 Op Scheduler and buffer 312. The RISC86 Op Scheduler 312 holds up to 24 RISC Ops and stores a total of 48 registers using register renaming. The Scheduler 312 contains logic to track instructions from decode to retirement, determining dependencies, scheduling execution, and commiitting architectural state. The Scheduler 312 is structured as a FIFO queue with instructions entering the queue four at one time to match the macroinstruction decoder bandwidth and up to four instructions retiring at one time at the end of the queue. Instructions enter the Scheduler 312 after decoding or fetching and remain in the scheduler queue until retirement. The Scheduler 312 queue is a general structure for usage for all categories of instructions and thus serves to hold instructions directed to different execution units. The Scheduler 312 utilizes implicit register renaming, which is based on position within the queue rather than explicit tag assignments, so that the Scheduler 312 avoids usage of full renaming hardware.

The Scheduler 312 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp[7:0] terms 3-RISC86 Op groups. The selection of 3-RISC86 Op groups is convenient since 24 RISC86 Ops are allocated in the Scheduler 312. The eight group terms are combined in a three-level tree to create a group carry in terms Cgrp[7:0]. The group carry terms Cgrp[7:0] are used within each group to select the operand source Op.

The RISC86 Op Scheduler 312, under control of an instruction control unit 314, issues up to six RISC86 Operations using out-of-order issuing to seven parallel execution units. The execution units speculatively execute the RISC86 Ops to generate results. The RISC86 Op Scheduler 312 retires the results in-order. The execution units include a load unit 316, a store unit 318, an integer X register unit 320, a Multi-Media eXtension (MMX) unit 322, an integer Y register unit 324, a floating-point unit (FPU) 326, and a branch resolving unit 328. A branch logic unit 330 implements a branch prediction operation that uses two-level branch prediction based on an 8192-entry Branch History Table (BHT) 332, a 16-entry Branch Target Cache (BTC) 334, and a 16-entry Return Address Stack (RAS) 336.

The dual instruction decoders 310 translate X86 instructions on-the-fly into corresponding RISC86 Ops. The RISC86 Ops are executed by an instruction core 338 that is essentially a RISC superscalar processing engine. The fetch logic 308 fetches up to sixteen instruction bytes each cycle from the L1 instruction cache 302 and transfers the instruction bytes into an instruction buffer (not shown) preceding the dual instruction decoders 310 so that the instruction buffer is maintained at capacity. The dual instruction decoders 310 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 312. The RISC86 Op Scheduler 312 controls and tracks multiple aspects of RISC86 Op issue and execution.

The microprocessor 300 executes up to six operations per clock. Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 312, functioning as a reorder buffer, commits the RISC86 Ops in-order to ensure precise exception handling and full operational compatibility with X86 architecture standards. The RISC86 Op Scheduler 312 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 312 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 316 loads data via a level-one (L1) dual-port data cache 340 which receives data from an external memory (not shown) via the processor system bus interface 304. Bypass (not shown) and storage buffers (not shown) for data (4×16) to the data cache 340 are supplied to allow data-in and data flow-back to cache output terminals.

The data cache 340 includes a 128-entry data translational lookahead buffer (DTLB) 344. The data cache 340 is a 2-way set-associative, 32 KB size cache with a 64 byte line-size and 32-byte sub-blocking. The data cache 340 fills on the basis of the 32-byte sub-block units. In contrast to the L1 instruction cache 302, the data cache 340 uses a Least Recently Missed (LRM) selection technique which is generally a more accurate way selection scheme than the LRU technique of the L1 instruction cache 302. In the LRM scheme, the line that first enters the cache is replaced. An alternative random replacement algorithm is supported and activated through usage of a SR5.DCERLR configuration bit. The data cache 340 also supports a direct-mapped replacement algorithm, reducing the cache size from 32 KB to 16 KB, using an SR5.DCDM configuration bit.

The data cache 340 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 340 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 318 transfers data to the data cache 340 through a store queue 342.

The MMX unit 322 is implemented to incorporate an X86 instruction subset called the Multi-Media eXtensions (MMX) thereby supporting a growing number of applications in the areas of communications and multimedia. The MMX unit 322 supports the new instructions and the new data types that are defined by the MMX standard to increase processor performance in the targeted applications. The MMX unit 322 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 322 supports 57 new instructions that execute additions, subtractions, multiplies, multiply-accumulates, logical shifts, arithmetic shifts, and several other operations. Most operations are executed on operands of any data type.

Figure 4:
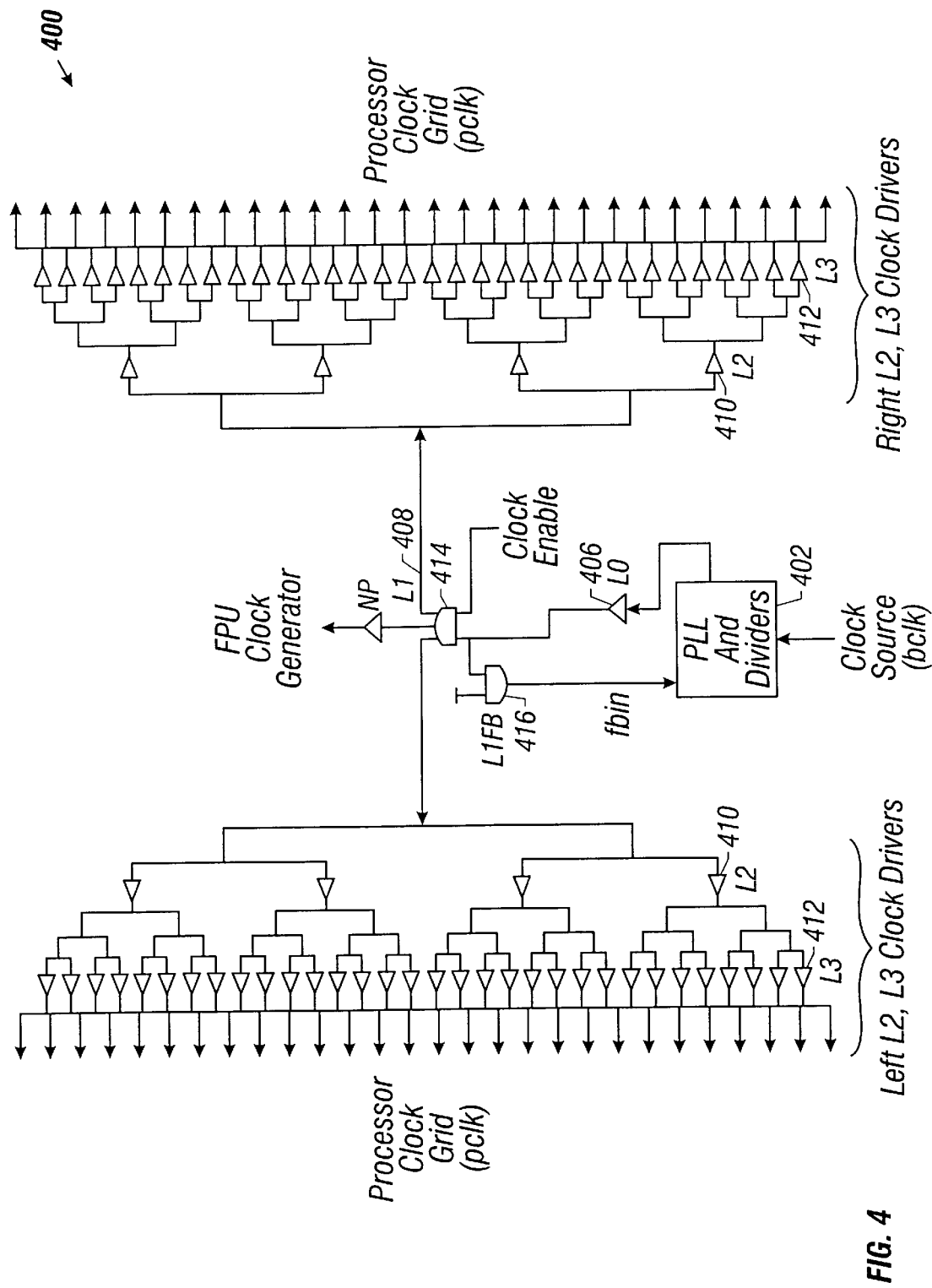
FIG. 4 is a schematic circuit and block diagram illustrating a processor clock distribution system that is suitable for usage in the microprocessor.

Referring to FIG. 4, a schematic circuit and block diagram illustrates a processor clock distribution system 400 that is suitable for usage in the microprocessor 300. The processor clock distribution system 400 supplies a single phased processor clock signal (PCLK), to drive the flip-flop-based modules (not shown) of the microprocessor 300. The purpose of the processor clock distribution system 400 is to buffer and generate a clock signal (PCLK) that is an accurate reproduction of the frequency and duty cycle of the weakly-driven clock produced by a phase-locked loop (PLL) 402. PCLK is distributed through a tree structure of four levels of clock buffer, L0, L1, L2 and L3 covering a large area and having less than 150 ps of clock skew. The PLL 402 generates the single-phase processor clock signal (PCLK) and synchronizes PCLK to a bus clock signal (BCLK). The PCLK distribution system 400 includes the four stages of buffering, L0 406, L1 408, L2 410 and L3 412. The last buffering stage (L3) drives a clock grid 404.

Figure 5:
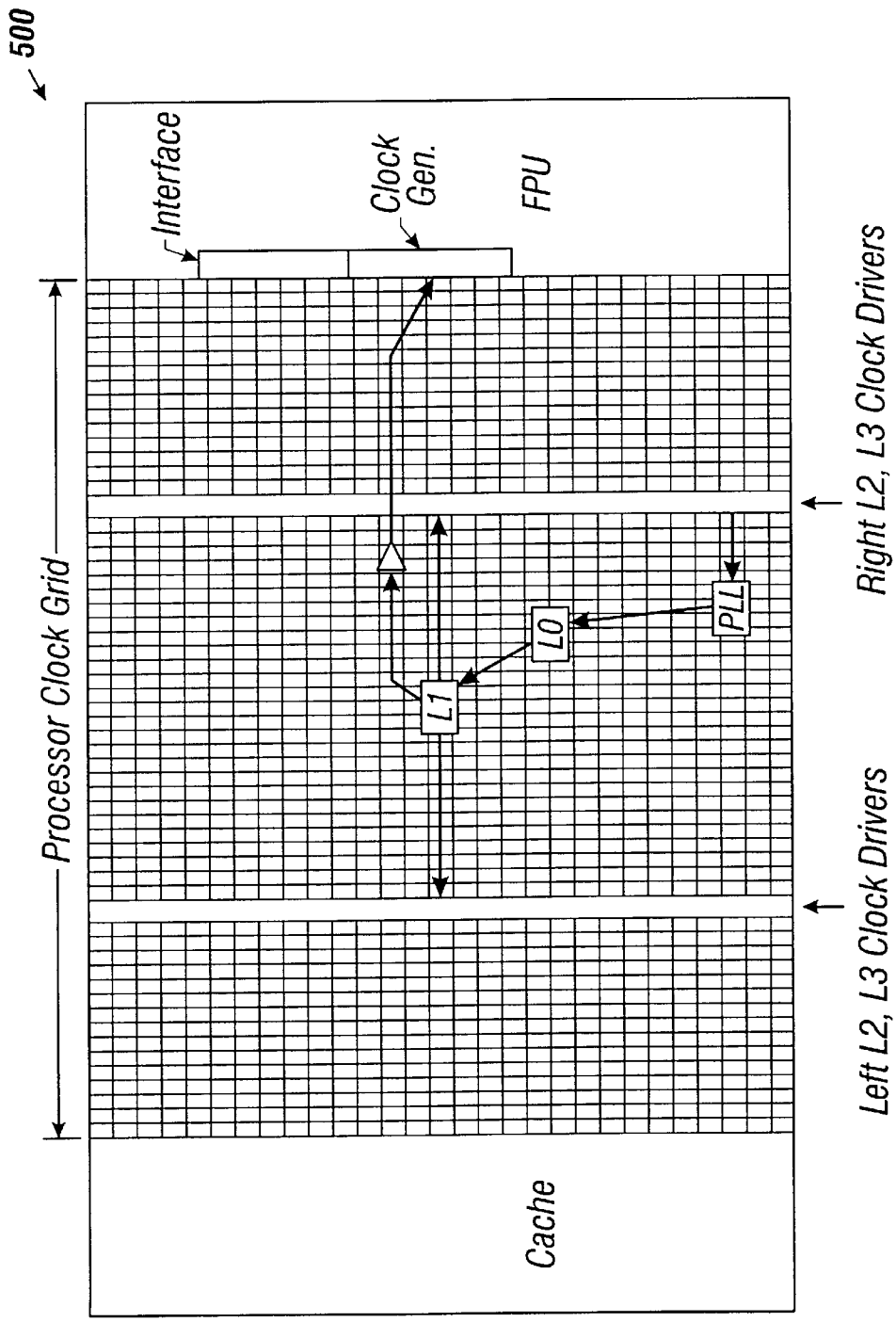
FIG. 5 is a schematic pictorial diagram showing a processor clock distribution system layout.

To facilitate power-down modes of the microprocessor 300, the centrally located L1 buffer 408 is selectively enabled and disabled using an AND-gate 414. The result of disabling the L1 clock buffer 408 is a static low PCLK signal. Independent of whether the clock driver modules are enabled or disabled, a permanently enabled scaled replicas of the L1 408, L2 410 and L3 412 buffers, namely L1FB 416, L2FB 418, and L3FB 420 (shown in FIG. 6) continue to feedback a clock signal to the PLL 402 with a matched delay that is representative of the enabled clock tree. The clock signal PCLK is connected back to the PLL 402 by the matched free-running clock replica path L1FB 416, L2FB 418, and L3FB 420 that delivers a clock signal PCLK2 which is matched to signal PCLK to maintain synchronization. The clock signal PCLK is distributed by a meshed clock grid 500 of interconnects shown in FIG. 5. The meshed clock grid 500 is driven by two columns of L3 clock drivers 412. The regional clock load within the meshed clock grid 500 is assessed and regional clock driver strength is programmed into a contact 2 mask layer to reduce variation in clock rise time and clock skew using computer-aided design (CAD) tools.

Figure 6:
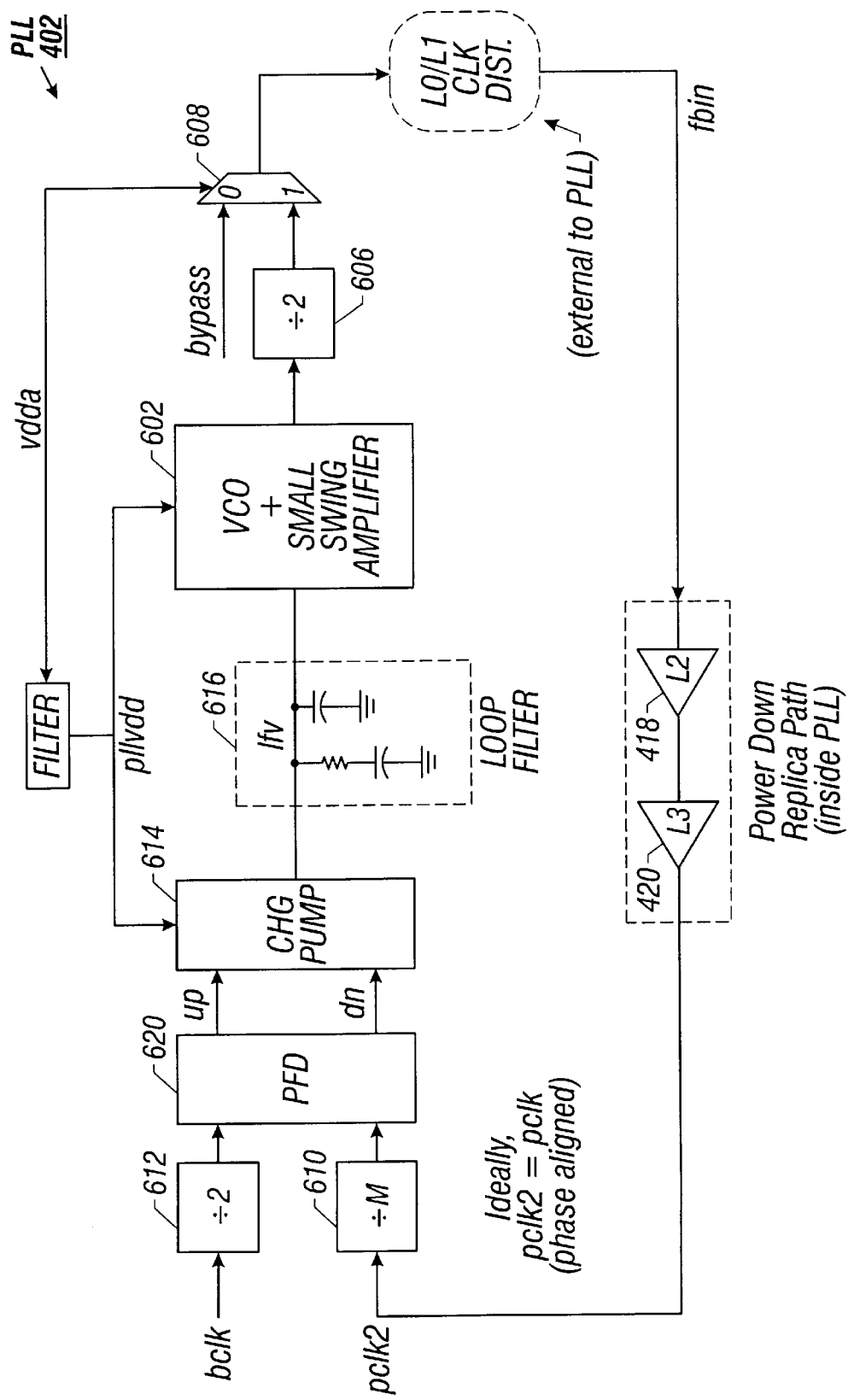
FIG. 6 is a schematic block diagram that depicts an embodiment of the PLL in the processor clock distribution system.

Referring to FIG. 6, a schematic block diagram depicts an embodiment of the PLL 402, which is included in the processor clock distribution system 400. The on-chip PLL 402 performs half-integer frequency multiplication via a divide by two frequency divider 612 in the reference bus clock (BCLK) path and performs clock generation using a circuit design that produces extremely low supply-noise-induced jitter. The PLL 402 includes a fully differential voltage-controlled oscillator (VCO) 602. The VCO 602 generates a clock signal at a clock rate that is halved by a frequency divider 606 to supply the PCLK signal at a 50% duty cycle. The PCLK signal is passed through an output multiplexer 608 to the L0/L1 global clock grid of the processor clock distribution system 400. The output multiplexer 608 selectively permits bypass of the PCLK signal and application of an alternative bypass clock signal. The PLL 402 incorporates minor-loop feedback 604 that is applied to maintain a substantially constant VCO signal amplitude independent of oscillation frequency. The minor-loop feedback 604 includes an internal replica L2/L3 clock block, a power-down replica path including the stages L2FB 418, and L3FB 420. The minor-loop feedback 604 generates the clock signal PCLK2 that is phase aligned with the clock signal PCLK. The clock signal PCLK2 is divided in clock rate by a frequency divider 610 that reduces the rate by a factor M. The reduced rate feedback clock signal is applied, along with the bus frequency divided by two by a frequency divider 612, to a phase frequency detector 620. The phase frequency detector 620 produces UP and DN pulses, each of which is translated to true and complement pulses that control a charge pump 614. The UP and DN pulses transmit phase and frequency information about the reference timing signal BCLK and the processor clock timing signal PCLK2 frequency and alignment to the charge pump 614. The phase frequency detector 620 amplifies phase detector UP and DOWN signals without distorting pulsewidth. The charge pump 614 controls the frequency of oscillation of the VCO 602 via an RC loop filter 616 which produces a loop filter voltage (LFV). The charge pump 614 uses a bandgap reference (not shown) which is based on substrate PNP transistors to produce a charge pump current that is independent of process, temperature, and power supply. The charge pump 614 has a series switch topology utilizing a voltage follower buffer (not shown) that suppresses charge sharing errors that sometimes occur when the UP and DN pulses change from the inactive mode (not controlling the LFV node) to an active mode (controlling the LFV node).

When the PLL 402 is in lock, the timing signal PCLK2 is phase aligned with the reference bus timing signal BCLK and the frequency of PCLK2 is M/2 times greater than the frequency of BCLK. A small-swing amplifier (not shown) in the VCO 602 receives the low voltage swing from the VCO 602 and translates the low voltage swing to the core VDD voltage level.

A power signal PLLVDD is applied to the charge pump 614 and the VCO 602 through an active power supply filter 100 that substantially reduces jitter caused by supply noise. The active power supply filter 100 receives power from a dedicated pin VDDA that is tied to a VDDIO (3.3 V) source on a computer motherboard (not shown). By receiving power from the VDDA pin rather than the chip level VDDIO source avoids power supply switching noise generated by I/O switching currents interacting with IC chip package power and ground inductance.

Figure 7:
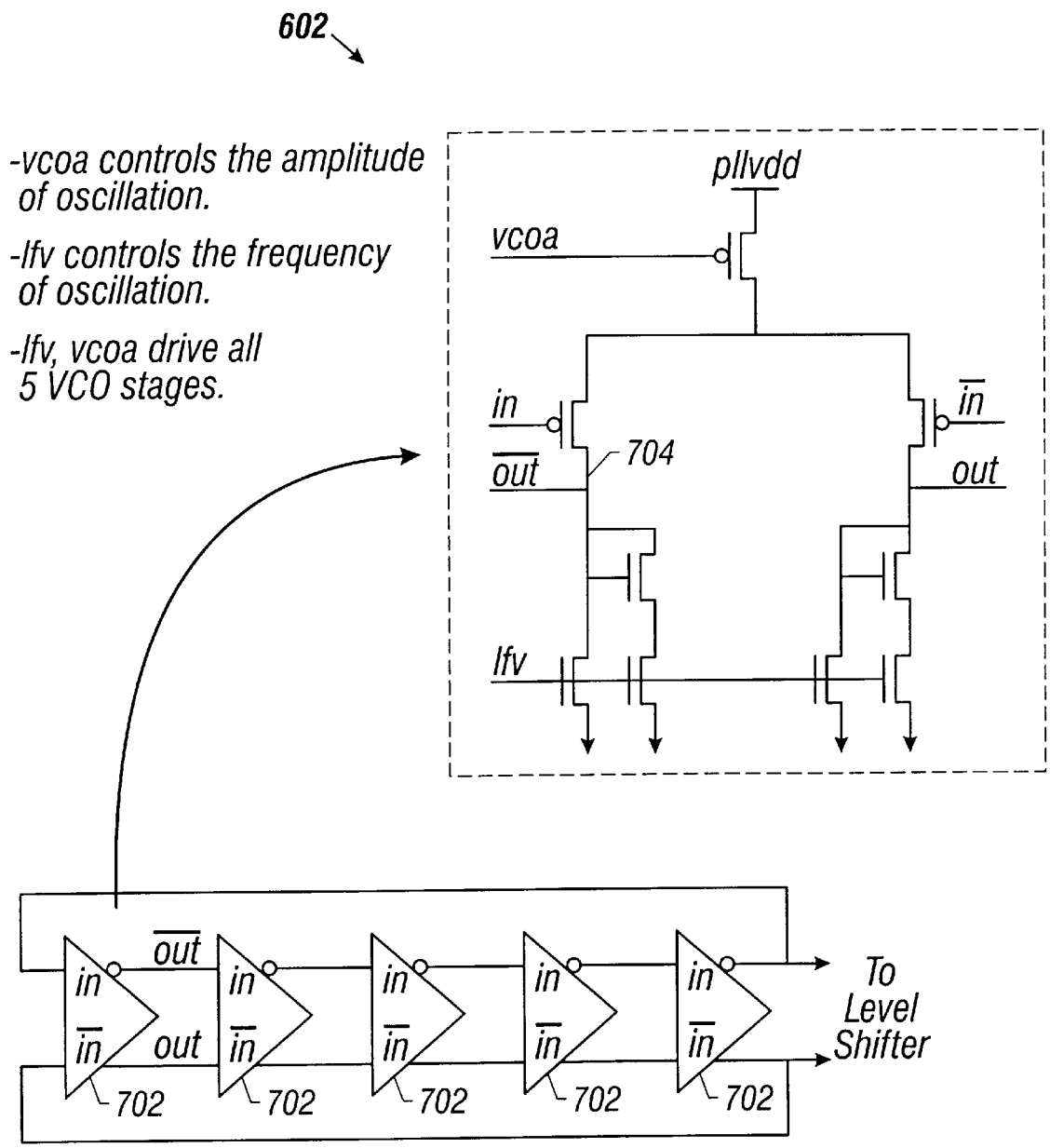
FIG. 7 is a schematic circuit diagram showing an embodiment of the VCO in the PLL shown in FIG. 6.

Referring to FIG. 7, a schematic circuit diagram depicts an embodiment of the VCO 602 which employs five VCO delay stages 702, each including current mode logic (CML) triode loads 704 to attain a per-stage delay that is insensitive to supply-noise-induced tail current fluctuations. The VCO 602 achieves good common mode noise rejection. The frequency generated by the VCO 602 is controlled by the loop filter voltage (LFV) and the amplitude of the VCO 602 is controlled by the voltage VCOA. The CML triode loads 704 produce a fixed resistance R for a fixed LFV. When the CML triode loads 704 are used in conjunction with the input load capacitance (C) of the next stage that is driven (C), then a per-stage delay of R*C is produced which is insensitive to current fluctuations that are induced by supply noise. Minor-loop feedback 604 controls the VCOA voltage level so that a constant amplitude of oscillation is independent of the frequency of oscillation.

In an illustrative embodiment, the differential VCO is a five stage oscillator with an additional stage both at the input and output sides of the VCO to preserve regularity and to reduce the incidence of etch and photomasking errors due to the close proximity of integrated circuit structures.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

Although in the illustrative embodiment, the resistive element 102 and the capacitive element 104 are CMOS devices constructed using a generic CMOS process, in other embodiments other types of resistive and capacitive elements may be employed including conventional resistors and capacitors. The resistors and capacitors are either connected externally or fabricated on an integrated circuit chip along with the active power supply filter and other circuits.

What is claimed is:

1. A processor comprising:
    an instruction decoder;
    a scheduler coupled to the instruction decoder;
    an execution core including a plurality of execution units; and
    a timing control circuit coupled to the execution core and the scheduler; the timing control circuit including a phase-locked loop circuit including:
        a phase detector for generating an output signal that is the function of the phases and frequencies of an input signal and a signal fed back to the phase detector;
        an amplifier coupled to the phase detector;
        a voltage-controlled oscillator coupled to the phase detector and the amplifier, the voltage-controlled oscillator providing the signal fed back to the phase detector; and
        a power supply filter coupled to the voltage-controlled oscillator, the power supply filter including:
            an RC element coupled to a power supply line for connecting to a power source; and
            a switch coupled between the power supply line and a control node coupled to the voltage-controlled oscillator, the switch having a control terminal coupled to the RC element, the switch being a source-follower circuit.

2. A processor according to claim 1, wherein:
    the switch is a MOSFET having a source-drain pathway coupled between the power supply line and the node for connection to the voltage-controlled oscillator and having a gate coupled to the RC element.

3. A processor according to claim 1, wherein: the RC element includes:
    a p-channel MOSFET having a source-drain pathway coupled between the power supply line and the control node coupled to the control terminal of the switch; and
    an n-channel MOSFET coupled between the control node and a reference source voltage.

4. A processor according to claim 1, wherein: the RC element includes:
    a p-channel MOSFET having a source-drain pathway coupled between the power supply line and a control node; and
    an n-channel MOSFET coupled between the control node and a reference source voltage; and
    the switch is an n-channel MOSFET having a source-drain pathway coupled between the power supply line and the node for connecting to the voltage-controlled oscillator and having a gate coupled to the RC element.

5. A processor according to claim 1, further comprising:
    a capacitor coupled between the node for connecting to the voltage controlled oscillator and the reference source voltage.

6. A processor according to claim 1, further comprising:
    an n-channel MOS capacitor coupled between the node for connecting to the voltage-controlled oscillator and the reference source voltage.

* * * * *